United States Patent
Kovalsky et al.

(10) Patent No.: US 11,728,649 B2
(45) Date of Patent: *Aug. 15, 2023

(54) FAST POST-FAULT PHASE REACTANCE BALANCING

(71) Applicant: Smart Wires Inc., Union City, CA (US)

(72) Inventors: Leonard J. Kovalsky, Winter Springs, FL (US); Hamed Khalilinia, Hayward, CA (US); Niloofar Torabi, Menlo Park, CA (US); Michael T. Garrison Stuber, Newman Lake, WA (US); Sana Tayyab, Punjab (PK); Adeel Ahmad Khan, Lahore (PK); Haroon Inam, San Jose, CA (US)

(73) Assignee: Smart Wires Inc., Durham, NC (US)

( * ) Notice: Subject to any disclaimer, the term of this patent is extended or adjusted under 35 U.S.C. 154(b) by 165 days.

This patent is subject to a terminal disclaimer.

(21) Appl. No.: 17/351,960

(22) Filed: Jun. 18, 2021

(65) Prior Publication Data

US 2021/0313806 A1    Oct. 7, 2021

Related U.S. Application Data

(63) Continuation of application No. 16/700,073, filed on Dec. 2, 2019, now Pat. No. 11,063,433.

(Continued)

(30) Foreign Application Priority Data

Oct. 16, 2019    (PK) .................................... 685/2019

(51) Int. Cl.
*H02J 3/18*    (2006.01)
*H02J 13/00*    (2006.01)
(Continued)

(52) U.S. Cl.
CPC .............. *H02J 3/18* (2013.01); *G01R 31/086* (2013.01); *H02H 1/0007* (2013.01); *H02J 13/00019* (2020.01)

(58) Field of Classification Search
CPC .. H02J 3/18; H02J 13/00019; H02J 13/00004; H02J 3/22; G01R 31/086; H02H 1/0007; Y02E 40/70; Y04S 10/22
(Continued)

(56) References Cited

U.S. PATENT DOCUMENTS 7,105,952 B2 *    9/2006    Divan .................... H01F 38/14
                                                    323/207
8,816,527 B1 *    8/2014    Ramsay ............ H02J 13/00024
                                                    307/14
(Continued)

FOREIGN PATENT DOCUMENTS

WO    2013/013282 A1    1/2013
WO    2017203099 A1    11/2017

OTHER PUBLICATIONS

Extended European Search Report dated Feb. 24, 2020; European Patent Application No. 19212101.0 (5 pages total).
(Continued)

*Primary Examiner* — Dharti H Patel
(74) *Attorney, Agent, or Firm* — Womble Bond Dickinson (US) LLP (57) ABSTRACT

Disclosed is a reactance-injecting module and its method of use to balance the currents among the phases of polyphase electric power transmission lines or to manage power flow among alternate paths, where the reactance-injecting module has high-speed, dedicated communication links to enable the immediate removal or reduction of injected reactance from all phases of a phase balancing cluster when a fault is detected on any one of the multiple phases. The reactance-injecting module may communicate information on a
(Continued)

detected fault to the other reactance-injecting modules of the phase balancing cluster within 10 microseconds after the fault is detected to allow the phase balancing cluster to eliminate injected reactance from all phases within a time that is short compared to a cycle of the alternating current, such as 1 millisecond after the fault is detected. This provides extremely fast neutralization of injected reactance to minimize interference with fault localization analyses.

20 Claims, 4 Drawing Sheets

Related U.S. Application Data (60) Provisional application No. 62/779,805, filed on Dec. 14, 2018.

(51) Int. Cl.
   *G01R 31/08* (2020.01)
   *H02H 1/00* (2006.01)

(58) Field of Classification Search
   USPC .......................................................... 361/85
   See application file for complete search history.

(56) References Cited

U.S. PATENT DOCUMENTS

| | | | |
|---|---|---|---|
| 9,172,246 B2* | 10/2015 | Ramsay | H02J 13/00024 |
| 9,281,689 B2 | 3/2016 | Boardman et al. | |
| 9,906,031 B2* | 2/2018 | Ramsay | H02J 3/1828 |
| 10,097,037 B2* | 10/2018 | Inam | H02J 13/00022 |
| 10,903,653 B2* | 1/2021 | Farahani | H02J 3/1807 |
| 2015/0084434 A1 | 3/2015 | Mousavi et al. | |
| 2017/0235286 A1 | 8/2017 | Inam et al. | |
| 2017/0328945 A1 | 11/2017 | Achanta | |

OTHER PUBLICATIONS

Gyugyi, Laszlo et al., "Static Synchronous Series Compensator: A Solid-State Approach To the Series Compensation of Transmission Lines", IEEE Transactions on Power Delivery, vol. 12, No. 1, pp. 406-417, Jan. 1997.

Zayandehroodi, Hadi et al., "A Comprehensive review of protection coordination methods in power distribution systems in the presence of DG", Przeglad Electrotechniczny (Electrical Review), ISSN 0033-2097, R. 87 NR, pp. 142-148, Aug. 2011.

Examination Report dated Feb. 22, 2023; Indian Patent Application No. 201944049571 (6 pages total).

\* cited by examiner

FAST POST-FAULT PHASE REACTANCE BALANCING

CROSS-REFERENCE TO RELATED APPLICATIONS

This application is a continuation application of U.S. Non-Provisional application Ser. No. 16/700,073, filed on Dec. 2, 2019, which claims the priority and benefit of Pakistan Patent Application No. 685/2019 filed on Oct. 16, 2019 and U.S. Provisional Application No. 62/779,805 filed on Dec. 14, 2018, the disclosures of which are incorporated herein by reference in their entireties.

TECHNICAL FIELD

This invention generally relates to alternating current, multiphase electric power transmission systems, particularly systems and methods to inject reactance to improve the phase balance or manage power flow in those power transmission systems. More specifically, the invention relates to techniques for facilitating the rapid isolation of faults in such power transmission systems.

BACKGROUND

High capacity electric power transmission systems using alternating current typically operate with three phases, using a three-wire system for transmission. (The subject technology described focuses on three phases even though more than three phases, or generally referred to as polyphase, may be used in other circumstances.) Nominally, each of the three wires has a voltage and current waveform that is 120° leading or lagging relative to its two companions, and each wire is carrying the same RMS current. In alternating current, polyphase electrical transmission systems, current imbalance among the phases has the effect of reducing the total capacity of the transmission system. Imbalance can come from unbalanced power sources, unbalanced loads or unbalanced line impedances. One way of correcting the imbalance is adding a controlled series reactance to one or more of the lines making up the transmission path.

Figure 1:
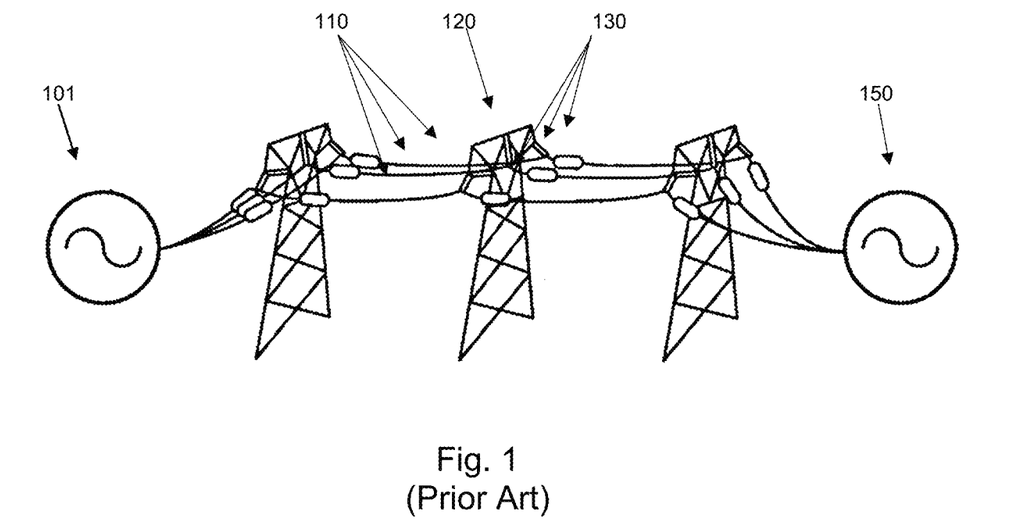
FIG. 1 shows an exemplary diagram of a reactance injection configuration based on distributed series reactors known in the art.

U.S. Pat. No. 9,172,246 by Ramsay, et al. ("Phase balancing of power transmission system") describes a reactance injection module that couples magnetically to transmission lines using a clam-shell-like transformer that clamps on each of the individual phase conductors, as illustrated in FIG. 1. In FIG. 1, the power source 101, a turbine generator for instance, connects to three conductors 110. Reactance modules 130 are clamped to the conductors near the supporting towers 120. The ultimate load 150 is at the end. This diagram is simplified because there may be multiple loads 150 located at various locations along the transmission path. Further, there may also be multiple power sources 101 supporting the network such as when stationary turbine power sources are combined with wind driven generators and solar arrays.

Injected reactance is also useful to manage the power flow when alternate transmission paths are available. For example, if one path is under-loaded and another is over-loaded, injecting reactance in the overloaded path will divert current to the under-loaded path, and the overall system capacity will be increased.

U.S. Pat. No. 8,816,527 by Ramsay, et al. describes the use of current measurements across the network, computer algorithms and communications with individual reactance modules to effect an optimization of the network ("Phase balancing of power transmission system" ('527 patent)). The '527 patent discloses a system that uses radio frequency (RF) communications to control the individual reactance modules, each called a distributed series reactor (DSR). FIG. 12C of the '527 patent shows an RF transceiver associated with the microcontroller responsible for controlling the reactance of an individual DSR module.

U.S. Pat. No. 10,097,037 by Inam et al. expands on the control aspects of the network ("System and method for distributed grid control with sub-cyclic local response capability" ('037 patent)), and uses static synchronous series compensators, described by Gyugyi, et al. ("Static synchronous series compensator: a solid-state approach to the series compensation of transmission lines," IEEE Transactions on Power Delivery, Volume: 12, Issue: 1, January 1997).

Figure 2:
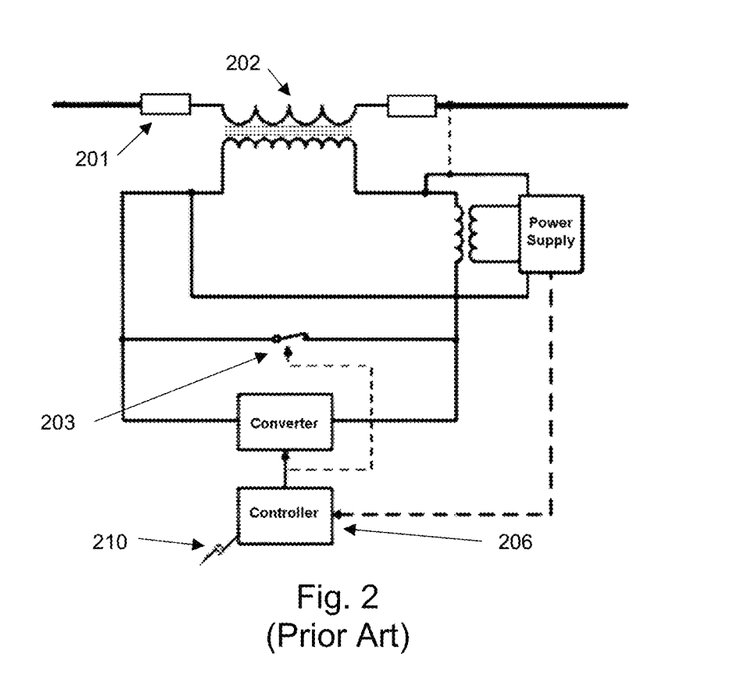
FIG. 2 shows a block diagram of an intelligent distributed static synchronous series compensator with RF communications capability known in the art.
Figure 3:
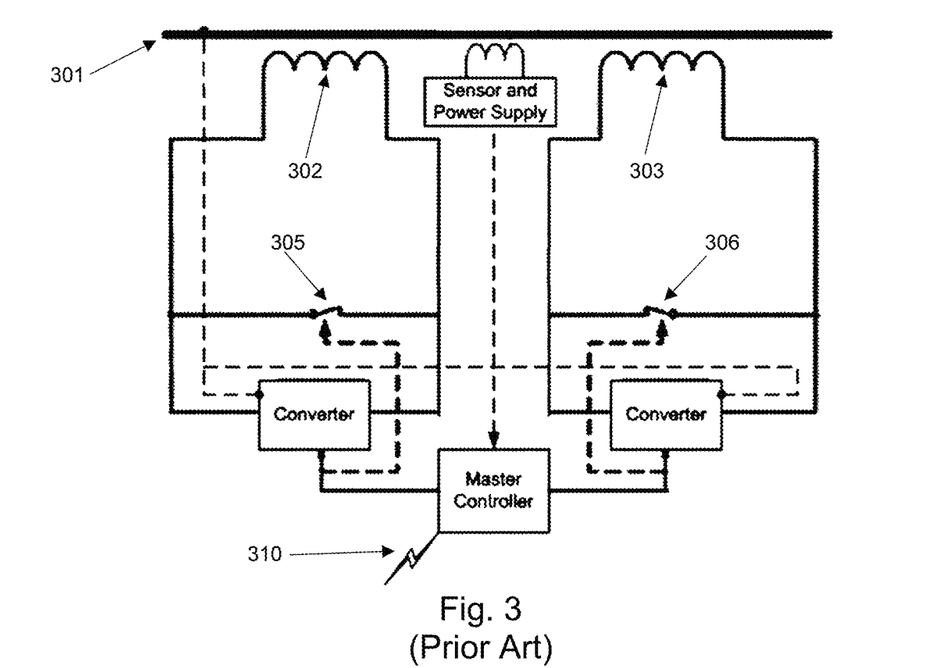
FIG. 3 shows a block diagram of a dual secondary intelligent distributed static synchronous series compensator with RF communications capability known in the art.

FIGS. 2 and 3 replicate illustrations from the '037 patent. In FIG. 2, the power line attaches to connectors 201 to allow current to pass through the primary 202 of a transformer coupling to the balance of the reactance-injecting module. The converter creates a signal that is out of phase with the voltage of the power line, and this signal, inductively coupled to the power line, emulates a series reactance. A bypass switch is indicated by 203; when this switch is closed, the injected reactance is reduced to essentially zero. The controller 206 is associated with a transceiver, allowing radio communication 210 of status and control. FIG. 3 has similar features; the power line 301 is inductively coupled to two secondary windings 302 and 303. These windings connect to two converters, each of which may create an out-of-phase signal that acts as a series reactance. Again, bypass switches 305 and 305 can eliminate all injected reactance when they are closed. The master controller is associated with a transceiver, which allows radio communication 310 of status and control.

Figure 4:
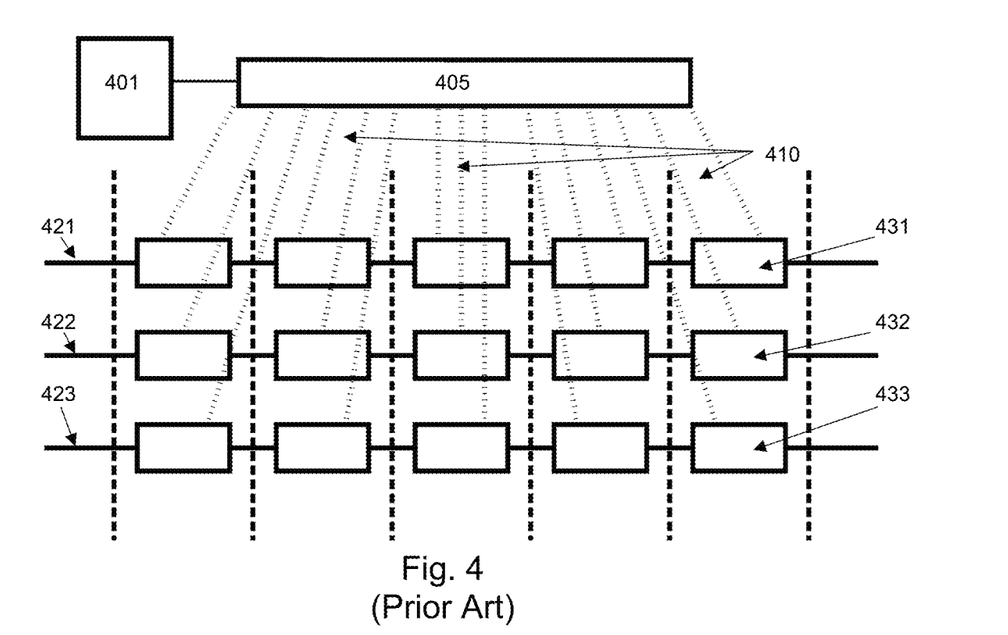
FIG. 4 shows a block diagram of a network of reactance-injecting units controlled centrally via a communications network known in the art.

FIG. 4 is a simplification of FIG. 12A of the '527 patent. This figure shows the overall system for optimizing the power flow in a three-phase transmission trunk. The overall system control resides in a utility controller 401 that connects to all the reactance modules, represented by 431, 432 and 433 through a communications network 405. The communications network 405 may be a combination of wired or fiber optic communications and RF communications. The final link 410, from the communication network 405 to the modules 431, 432, 433, is an RF link, for communicating to the RF transceivers in each module. Communication across 405 and 410 is bidirectional, so monitored information from sensors in the modules can be delivered to the utility controller 401, and control information from the utility controller 401 may be delivered to the reactance-injecting modules. Overall, the combination of monitoring, communication and control implemented in components 401, 405, 410 makes it possible to optimize the current flow in the power lines 421, 422, 423 by properly adjusting the reactance injection by the reactance-injecting modules 431, 432, 433 and their companions along the transmission trunk.

In operation, power transmission systems experience faults. Faults may arise from a variety of sources, like shorted or downed power lines or rogue equipment loads placed on the system. In order to maintain the physical integrity of the transmission system and to maintain the most effective service, a system controller, with support from line monitors across the transmission area, will endeavor to localize and then isolate the fault. In order to avoid distortions in the fault localization process, it is best if all the injected reactance is minimized prior to the commencement of the fault analysis. Injected reactance can obscure the location of the fault, and it is important that any fault be isolated, cleared or de-energized as quickly as possible. However, in existing power transmission systems, communication delays through the network and the controller may put the entire localization process at risk. It is desirable to have a system that provides extremely fast neutralization of injected reactance to minimize interference with fault localization analyses.

SUMMARY

Disclosed herein is a reactance-injecting module and its method of use for balancing the current among the phases of polyphase electric power transmission lines or managing power flows among alternative paths, where the reactance-injecting module includes high speed, dedicated communication links to enable the immediate removal or reduction of injected reactance from all phases of a phase balancing cluster when a fault is detected on any one of the phases. In one embodiment, the phase balancing cluster may be phases that are controlled by related reactance-injecting modules that have the same positions relative to the flow of energy with the power transmission system. In one embodiment, the phase balancing cluster may be phases controlled by reactance-injecting modules positioned across groups of related reactance-injecting modules. In one embodiment, the reactance-injecting module may communicate information on a detected fault to the other reactance-injecting modules of the phase balancing cluster within 10 microseconds after the fault is detected to allow the reactance-injecting modules to remove all reactance injections from all phases of the phase balancing cluster within 1 millisecond after the fault is detected. As such, the reactance-injecting module provides extremely fast neutralization of injected reactance to minimize interference with fault localization analyses.

The reactance-injecting module for one phase of a polyphase transmission system may include a reactance modifying component, a current sensor, a first communication transceiver, one or more controllers, and a second communication transceiver. The reactance modifying component may be configured to inject reactance into the one phase of the polyphase transmission system in an operating mode, or to eliminate the injected reactance in a bypass mode. The current sensor may be configured to sense a current flow in the one phase of the polyphaser transmission system. The first communication transceiver may be configured to communicate with a centralized control system. The one or more controllers may be configured to determine whether a fault is detected in the one phase based on the current flow sensed by the current sensor. The one or more controllers may be further configured to operate the reactance modifying component in the bypass mode if a fault is detected, or to operate the reactance modifying component in the operating mode if a fault is not detected. The second communication transceiver may be configured to communicate information on the fault detected between the reactance-injecting modules of different phases of the multiphase transmission system to eliminate all reactance injected by all phases in a time less than a time for a fault localization analysis.

BRIEF DESCRIPTION OF THE DRAWINGS

The accompanying drawings are provided together with the following description of various aspects and embodiments of the subject technology for a better comprehension of the invention. The drawings and the embodiments are illustrative of the invention, and are not intended to limit the scope of the invention. It is understood that a person of ordinary skill in the art may modify the drawings to generate drawings of other embodiments that would still fall within the scope of the invention.

DETAILED DESCRIPTION

Examples of various aspects and variations of the subject technology are described herein and illustrated in the accompanying drawings. Objects, features, and advantages of the invention will be apparent from the following detailed description taken in conjunction with the accompanying drawings. While various embodiments of the subject technology are described, the following description is not intended to limit the invention to these embodiments, but rather to enable a person skilled in the art to make and use this invention.

Subject technology is disclosed for clearing all injected reactance in a polyphase transmission system immediately after a fault is detected. One goal of the subject technology is to minimize the injected reactance in a time that is small compared to a cycle to minimize interference with fault localization analyses; for example, in one embodiment, 1 millisecond (msec) is the objective, which is short compared to the 16.67 msec or 20 msec cycle periods common in power transmission systems.

Reactance-injecting modules may be deployed on each of the phases of a transmission system. Three phase transmission is most common, so the modules are installed in groups of three. Related modules refer to those modules that are positioned an electrically equivalent distance from the power source or sources. Related modules may be in relatively close physical proximity. For instance, the conductors for a 345 kV three phase transmission system may be spaced 10 meters apart. The distance between related modules may vary with voltage, but spacings may also depend on other design factors like wind loading, altitude and configuration. In an example used to describe the subject technology, related modules may be between 10 and 20 meters apart.

A reactance-injecting module has at its heart a mechanism for introducing reactance to a single power transmission line. The module may include a current sensor capable of quantifying the current flowing in the transmission line, a controller that is capable of receiving information, analyzing information, and activating the various functions within the module, a communication unit used to communicate with external components or other modules, and a power supply that harvests, through inductive coupling to the power line, the power necessary to operate the module. Module communications may require the use of a radio frequency (RF) transceiver. The module may also include one or more relays or semiconductor switches that effectively by-pass or remove the injected reactance.

Figure 5:
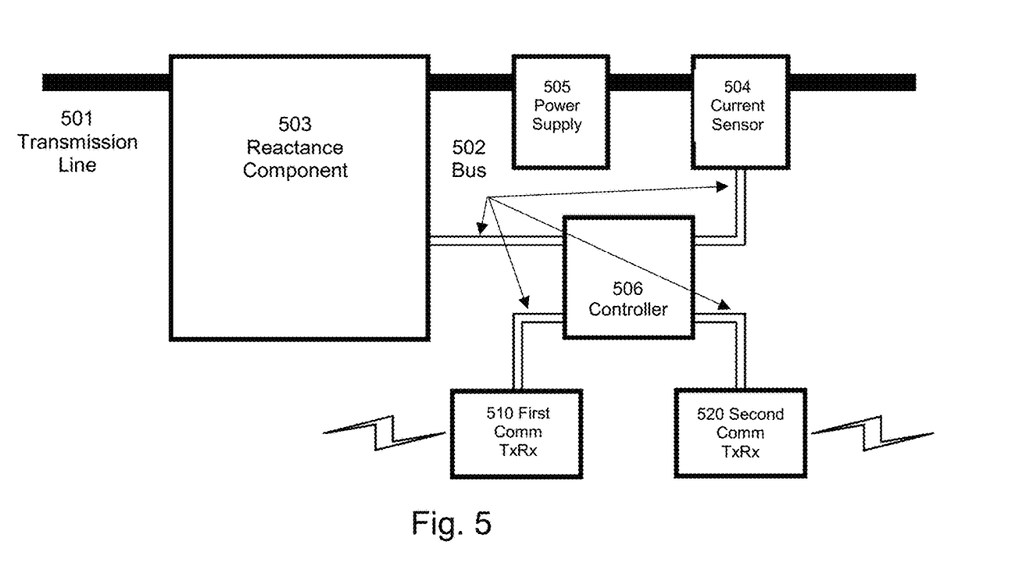
FIG. 5 shows a top-level block diagram of a reactance-injecting module with a first communications capability and a second communications capability to support fault analysis and response, in accordance with aspects of the subject technology.

FIG. 5 is a top-level block diagram of a reactance-injecting module with a first communications capability and a second communications capability to support fault analysis and response, in accordance with aspects of the subject technology. The reactance-injecting module may include a reactance component 503, a current sensor 504, a power supply 505, a controller 506, a first communication transceiver 510, and a second communication transceiver 520. A transmission line 501 is coupled to the reactance component 503. The reactance component 503 may be a collection of active and passive components configurable to inject reactance or to reduce, minimize, eliminate, or bypass injected reactance into the transmission line 501, which may be connected in series with the reactance component 503. Details of the reactance component will be further discussed. The power supply 505 is an electronic system that may be inductively coupled to the transmission line 501 in order to extract and control the relatively small amount of energy required to power the various components within the module. The current sensor 504 may be a combination of an induction coil and supporting electronics capable of measuring and quantifying the current flowing in the transmission line 501. Block 506 is the module controller, an electronic system capable of receiving information, analyzing information, or activating the various functions within a module. Buses 502 represent data paths within the module for interconnecting the controller 506 with the current sensor 504, the reactance component 503, and the two communication transceivers 510 and 520.

The communication transceivers 510 and 520 are electronic systems capable of transmitting and receiving information using radio frequency or optical communications. In one embodiment, the first communication transceiver 510 may be a link dedicated to exchanging information with a central power management computing system that manages a power transmission system having a network of reactance-injecting modules. The central power management computing system may specify which reactance-injecting module should be actively injecting reactance into the specific phases of the power transmission system.

The second communication transceiver 520 may be configured to support fault detection and fault response. For example, the second communication transceiver 520 may be configured to communicate fault information between related reactance-injecting modules. In one embodiment, the second communication transceiver 520 may communicate with related reactance-injecting modules through a dedicated channel in order to assure rapid and reliable communication, with a goal of communicating the existence of a fault within 10 microseconds after detection.

In one scenario, a fault may involve one transmission line 501 of the three phases contacting a grounded conductor, for example a tower or the earth. This creates a current surge, which is measured and communicated from the current sensor 504 to the controller 506. Fault criteria used to declare a fault may be programmed into the controller 506. In one embodiment, the fault criteria may be based on the nominal or emergency current ratings of the transmission line 501; one example of the fault criteria may define a fault as a current surge exceeding 150% of the emergency current rating of the transmission line 501. Fault criteria may be programmed from the central power management computing system into the reactance-injecting module or may be embedded in the control program in the module controller 506.

Immediately upon identifying a fault, the controller 506 may instruct the reactance component 503 to bypass the reactance injection or to reduce its injected reactance to the lowest possible value, approximately zero. This may be done by activating one or more silicon controlled rectifiers (SCRs) within the reactance module 503. The SCRs are four-layer silicon devices that when activated can short out the reactance injection circuitry in a short time, for example in 150 microseconds or less. In one embodiment, a shorting method may employ a contactor, a normally closed relay that carries the entire power line current when closed, but in its open condition allows the reactance injection circuitry to modulate the impedance or reactance of the power line; when power is removed from the contactor's control coil, it will close, creating a physical bypass to the reactance injection circuitry. In conjunction with shorting out the reactance injection circuitry, the controller 506 may send a signal to the second communication transceiver 520. In this example, neither of the other phases has experienced a fault, but to assure rapid fault localization, their respective injected reactances may be reduced to zero. The second communication transceiver 520 may send the fault identification message to each of the related reactance modules within 10 microseconds after the reactance-injecting module identifies a fault, and the related reactance modules may immediately activate shorting out their respective reactance injection circuitry, such that the injected reactance in all phases can be reduced to essentially zero in 1 millisecond or less. In some embodiments, communication of a fault identification message to the related reactance modules within 100 microseconds after a fault is identified may still enable the related reactance modules to reduce or eliminate their injected reactance in 1 millisecond or less.

The module controller 506 may be a single processing unit with memory, or it may be multiple processing units with dedicated or shared memory blocks. A multiple processor architecture could have one processor dedicated to fault detection and response, while the other processor manages unexceptional operations. In one embodiment, the controller 506 may be an instruction processor, such as a central processing unit (CPU), microcontroller, or a microprocessor that executes codes stored in the memory to perform the functions described. In other embodiments, the controller 506 may be an application specific integrated circuit (ASIC), programmable logic device (PLD), field programmable logic array (FPGA), or other circuitry to perform the functions described.

Figure 6:
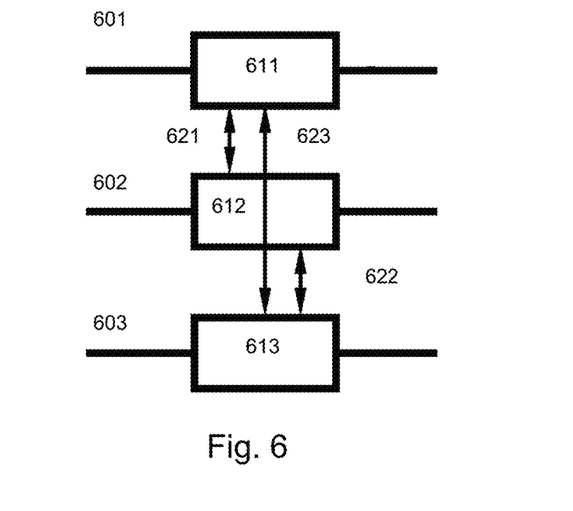
FIG. 6 shows the basic communications links among related reactance-injecting modules for fast fault response, in accordance with aspects of the subject technology.

FIG. 6 illustrates the communications links among related reactance-injecting modules for fast fault response, in accordance with aspects of the subject technology. In a three-phase transmission scheme, three transmission lines 601, 602 and 603 are supported by three reactance-injecting modules 611, 612 and 613. If the transmission trunk is supported by towers, the lines 601, 602, 603 are spaced by a distance that is based on their operating voltage. For example, 345 kV lines will be separated by 10 meters or more. The communication links in FIG. 6 are identified by 621, 622 and 623. These bidirectional communication links may be supported by dedicated transceivers, such as the communication transceiver 520, in each of the reactance-injecting modules. These communication links enable a fault identified in any one of the phases to cause the elimination of injected reactance in all three phases in a short period of time, such as in less than 1 msec. In one embodiment, the communication links among related reactance-injecting modules may be multiplexed in time, frequency, or orthogonal codes of a shared set of communication resources.

In order to assure fast and reliable communication of fault information, the communication link used by the communication transceiver 520 may be free of competing information. In one embodiment, such a communication link, referred to as a fault communication link, may reasonably be used to transmit other fault-related information. For example, if the fault criteria depend upon the balance of currents in the various phases, the fault communication link may be used to share current magnitudes of the various phases among related reaction injecting modules.

The communication transceivers 520 may be dedicated to radio communication over short distances, i.e., distances that are similar to the spacings among the phase conductors. These spacings may typically be fifty meters or less. Any one of the industrial, scientific and medical (ISM) radio bands could be used for these communications. These frequencies include bands at 2.45 GHz (2.4-2.5 GHz), 5.8 GHz (5.725-5.875 GHz), and 24.125 GHz (24-24.25 GHz), all of which currently have worldwide recognition. Higher frequency ISM bands, such as 61.25 GHz (61.0-61.5 GHz) and 122.5 GHz (122-123 GHz) are also recognized. In the U.S., the Federal Communication Commission (FCC) is also encouraging development of 64-66 GHz, 70 GHz (71-76 GHz), 80 GHz (81-86 GHz) bands, and higher millimeter wave bands. The choice of frequency will be based on its suitability to high speed communications (e.g., spectrum allocated), its suitability to communication in the tens-of-meters range, and its freedom from interference. These criteria favor the higher frequencies like those in the 61.25 GHz, 70 GHz and 80 GHz bands.

The reactance-injecting mechanism, such as the reactance component 503, may be implemented in different configurations. In one configuration, a power line may be surrounded by an iron core that couples to a secondary winding, which is configured to introduce inductive reactance when the secondary winding is open, or no reactance when the secondary is shorted. This configuration may be a component of a distributed series reactor (DSR).

In another configuration, a transformer primary may be connected in series with a power line, the transformer primary introducing inductive reactance when the secondary winding is open, or no reactance when the secondary is shorted. This configuration may also be a component of a DSR.

In another configuration, a transformer primary may be connected in series with a power line, with the secondary winding connected to active circuits that generate a controllable AC current differing in phase with the current in the power line. Induction in the transformer can introduce either capacitive or inductive reactance to the power line, as defined by the phase of the current passing through the secondary winding. This configuration may be a component of a distributed static synchronous series compensator (DSSSC).

In another configuration, a transformer primary may be connected in series with a power line, with the secondary winding connected to a voltage-sourced power converter with a DC capacitor for energy storage and timed injection to inject reactance into the power line. This configuration may be a component of a static synchronous series compensator (SSSC).

In another configuration, the power line may be directly connected in series to a coupling element, such as a voltage-sourced power converter with a DC capacitor for energy storage and timed injection, to inject reactance, such as reactance current, into the power line. The modes of energy storage, pass-through and injection are controlled by electronically timed solid state switching devices.

It is important that any one of these configurations have a mode in which the injected reactance can be reduced to a value approximating zero. This may be implemented by a contactor that shorts the injection, SCR's that short the injection, or an internal mode that eliminates or bypasses all injection.

In one embodiment of fault detection and fault communication, a reactance bypass module may be used. Such a module is intended to be connected in parallel with a reactance-injecting component. The reactance bypass module may contain just the elements that can be configured to bypass the separate reactance-injecting component, which may be embodied in the different configurations of the reactance component 503 described. In one embodiment, the reactance bypass module may include the power supply 505, current sensor 504, controller, 506, and the communication transceivers 510 and 520 of FIG. 5. The reactance bypass module may contain an element similar to the reactance component 503, but the element may have only a contactor and solid state switches like SCRs. When the switches are closed, all transmission line current passes through those switches, and none passes through the reactance-injecting component connected in parallel with the reactance bypass module.

In one embodiment, reactance-injecting modules may be used in fleets. A fleet is a closely spaced, series connection of multiple reactance-injecting modules. For example, a fleet may be a collection of reactance-injecting modules in close proximity to one another with an equal number of modules connected into each phase of a power transmission system. A fleet may be particularly applicable to distributed series reactors, where each reactance-injecting module is capable of injecting either a relatively small, fixed reactance or no reactance. Such a fleet is illustrated by FIG. 7.

Figure 7:
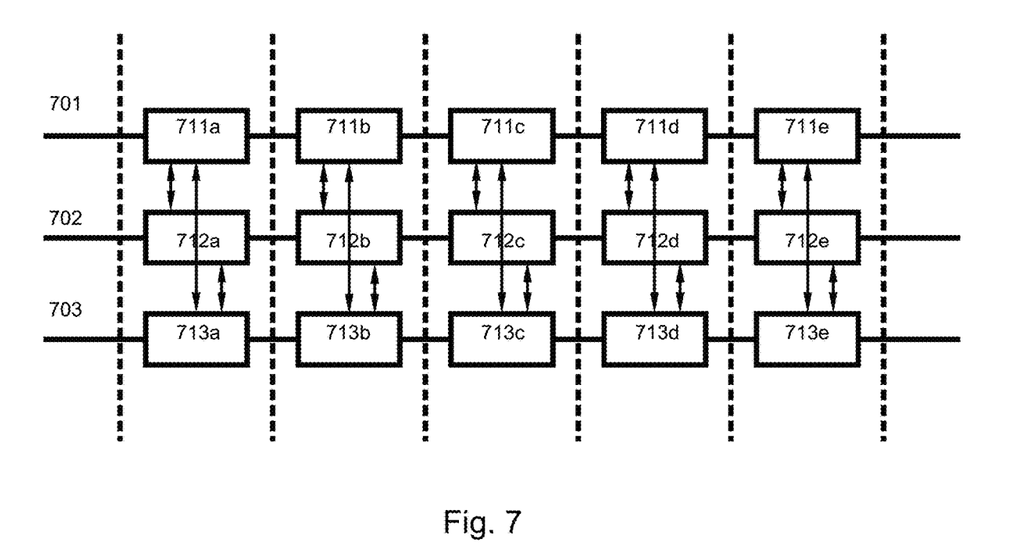
FIG. 7 shows a block diagram of the communications links for fast fault response in a fleet of reactance-injecting modules, in accordance with aspects of the subject technology.

FIG. 7 shows a block diagram of the communications links for fast fault response in a fleet of reactance-injecting modules, in accordance with aspects of the subject technology. Each of the phase lines 701, 702, 703 has several reactance-injecting modules, the number being determined by the total reactance designed into the fleet. For instance, line 701 is capable of being modified by reactance-injecting modules 711a, 711b, 711c, 711d and 711e. The communications scheme in this fleet is identical to that in FIG. 6. Related modules in the fleet, such as the reactance-injecting modules 711c, 712c and 713c that carry different phases but have the same positions relative to the flow of energy within the power transmission system, may communicate with each other using the fault communications links supported by the communication transceivers like 520 in FIG. 5.

Figure 8:
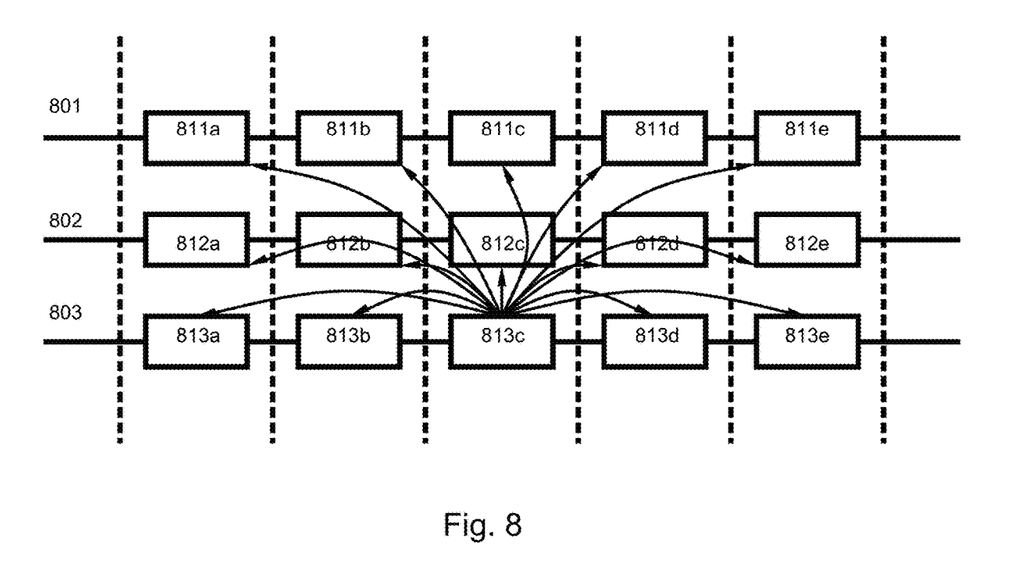
FIG. 8 shows a block diagram of an alternative communications scheme for fast fault response in a fleet of reactance-injecting modules, in accordance with aspects of the subject technology.

FIG. 8 shows a block diagram of an alternative communications scheme for fast fault response in a fleet of reactance-injecting modules, in accordance with aspects of the subject technology. In this scheme, each reactance-injecting module has a bidirectional, fault-related communication link with every other module in the fleet. This is illustrated solely for module 813c in FIG. 8. However, in this scheme, each of the modules may have similar communication links, sharing fault information with all other members of the fleet, not just among related modules. While this communications scheme may be applicable in some cases, the wide access among the multiple modules in the fleet may be difficult to configure to achieve the same communication speed available when communicating only among related modules.

While radio communication is the most natural scheme, particularly for transmission lines or tower-mounted reactance-injecting modules, alternative communication schemes might be available when reactance-injecting modules are mounted in banks or pods. These arrangements place the modules in rigid mountings, which may permit the use of optical communications, either free space or confined in optical fibers. These arrangements may take into account potentially very large voltage differences among the racks or pods supporting different phases of the transmission system.

Another alternative communication scheme may combine certain elements of communication transceivers 510 and 520 shown in FIG. 5. A single transceiver may support multiple channels or links, either by frequency division multiplexing, time division multiplexing, or code division multiplexing. In one embodiment, the fault response temporal requirements may demand that the fault communication channel or link be dedicated to fault information, just as the communication transceiver 520 is dedicated to communicating fault information.

The methods, devices, processing, and logic described above may be implemented in many different ways and in many different combinations of hardware and software. The controllers may comprise electronic circuitry and may be configured with hardware and/or firmware to perform the various functions described. For example, all or parts of the implementations may be circuitry that includes an instruction processor, such as a Central Processing Unit (CPU), microcontroller, or a microprocessor; an Application Specific Integrated Circuit (ASIC), Programmable Logic Device (PLD), or Field Programmable Gate Array (FPGA); or circuitry that includes discrete logic or other circuit components, including analog circuit components, digital circuit components or both; or any combination thereof. The circuitry may include discrete interconnected hardware components and/or may be combined on a single integrated circuit die, distributed among multiple integrated circuit dies, or implemented in a Multiple Chip Module (MCM) of multiple integrated circuit dies in a common package, as examples. The implementations may be distributed as circuitry among multiple system components, such as among multiple processors and memories, optionally including multiple distributed processing systems.

The circuitry may further include or access instructions for execution by the circuitry. The instructions may be stored in a tangible storage medium that is other than a transitory signal, such as a flash memory, a Random Access Memory (RAM), a Read Only Memory (ROM), an Erasable Programmable Read Only Memory (EPROM); or on a magnetic or optical disc, such as a Compact Disc Read Only Memory (CDROM), Hard Disk Drive (HDD), or other magnetic or optical disk; or in or on another machine-readable medium.

The foregoing description, for purposes of explanation, uses specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications. They thereby enable others skilled in the art to best utilize the invention and various embodiments with various modifications as are suited to the particular use contemplated. For example, while all the examples have been illustrated by three-phase power transmission systems, the principles described are equally applicable to any alternating current transmission configuration. That includes two-phase, three-phase, four-phase or any polyphase configuration. The examples are thus illustrative and non-limiting. It is intended that the following claims and their equivalents define the scope of the invention.

The invention claimed is:

1. A method for accelerating a fault localization process in an alternating current, polyphase powerline system utilizing a plurality of reactance injecting elements to inject reactance for load balance among phases of the polyphase powerline system, the method comprising:
sensing a fault current by one of the reactance injecting elements in any one phase of the polyphase powerline system;
creating a message indicating the sensed fault current; and
transmitting the message through a dedicated channel to one or more of the plurality of reactance injecting elements in other phases of the polyphase powerline system to reduce the injected reactance for every phase to approximately zero in a time that is short compared to a cycle of the alternating current.

2. The method of claim 1, wherein the polyphase powerline system includes three phases.

3. The method of claim 1, wherein the dedicated channel from the one phase in which the fault current is sensed to any of the other phases is a radio frequency communications link.

4. The method of claim 3, wherein the radio frequency communication link comprises one or more frequencies in an industrial, scientific and medical (ISM) band.

5. The method of claim 3, wherein the radio frequency communication link comprises one or more frequencies in a 2.4-2.5 GHz band, a 5.725-5.875 GHz band, a 24-24.25 GHz band, a 61.0-61.5 GHz band, a 64-66 GHz band, a 71-76 GHz band, or an 81-86 GHz band.

6. The method of claim 1, wherein the dedicated channel from the one phase in which the fault current is sensed to any of the other phases is an optical fiber communications link.

7. The method of claim 1, wherein the dedicated channel from the one phase in which the fault current is sensed to any of the other phases is a dedicated segment of a multiplexed communication system utilizing any one of frequency division multiplexing, time division multiplexing or code division multiplexing.

8. The method of claim 1, wherein the message indicating the sensed fault current in the one phase reaches any of the other phases within 10 microseconds after the fault current is sensed.

9. The method of claim 1, wherein the injected reactance is reduced for every phase within 1 millisecond of the fault current sensed in the one phase.

10. The method of claim 1, wherein the message indicating the sensed fault current in the one phase reaches any of the other phases within 100 microseconds after the fault current is sensed.

11. The method of claim 1, wherein sensing the fault current in the one phase comprises:
   sensing a current flow in the one phase; and
   determining that the current flow exceeds a threshold.

12. The method of claim 1, wherein sensing the fault current in the one phase comprises:
   sensing a current flow in the one phase; and
   determining that the current flow satisfies a fault condition.

13. The method of claim 12, further comprising:
   receiving the fault condition from a central power management system.

14. The method of claim 1, further comprising:
   sensing a current flow in the one phase; and
   transmitting information on the current flow to the reactance injecting elements of any of the other phases.

15. The method of claim 1, wherein to reduce the injected reactance for every phase to approximately zero, the method further comprises:
   eliminating the injected reactance in the one phase in a bypass mode; and
   causing the injected reactance in the other phases to be eliminated in the bypass mode.

16. The method of claim 1, further comprising:
   receiving, by the one phase through the dedicated channel, a fault current message from the one or more reactance injecting elements in the other phases; and
   eliminating the injected reactance in the one phase in a bypass mode in a time that is short compared to the cycle of the alternating current.

17. The method of claim 1, further comprising:
   transmitting the message to a central power management system through a separate channel.

18. The method of claim 1, wherein transmitting the message through the dedicated channel to one or more of the plurality of reactance injecting elements in other phases comprises:
   transmitting the message to a subset of the reactance injecting elements that are related by distances from a power source.

19. The method of claim 1, wherein to reduce the injected reactance for every phase to approximately zero in a time that is short compared to the cycle of the alternating current, the method further comprises:
   reducing the injected reactance for every phase in a time less than a time for a fault location analysis by the reactance injecting element of the one phase.

20. The method of claim 1, wherein there are an equal number of reactance injecting elements on each phase of the polyphase powerline system.

* * * * *